(12) United States Patent
Yu et al.

(10) Patent No.: US 9,730,329 B2
(45) Date of Patent: Aug. 8, 2017

(54) ACTIVE CHIP PACKAGE SUBSTRATE AND METHOD FOR PREPARING THE SAME

(75) Inventors: Zhongyao Yu, Beijing (CN); Xia Zhang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 493 days.

(21) Appl. No.: 14/360,906

(22) PCT Filed: Nov. 29, 2011

(86) PCT No.: PCT/CN2011/083118
§ 371 (c)(1),
(2), (4) Date: Nov. 18, 2014

(87) PCT Pub. No.: WO2013/078609
PCT Pub. Date: Jun. 6, 2013

(65) Prior Publication Data
US 2015/0109748 A1    Apr. 23, 2015

(51) Int. Cl.
*H01L 29/06* (2006.01)
*H05K 1/18* (2006.01)
(Continued)

(52) U.S. Cl.
CPC ........... *H05K 1/188* (2013.01); *H01L 21/561* (2013.01); *H01L 21/78* (2013.01); *H01L 23/49822* (2013.01); *H01L 23/49827* (2013.01); *H01L 23/5389* (2013.01); *H01L 24/19* (2013.01); *H01L 24/24* (2013.01); *H01L 24/82* (2013.01); *H01L 24/96* (2013.01); *H01L 25/16* (2013.01); *H01L 25/50* (2013.01); *H05K 1/115* (2013.01); *H05K 1/185* (2013.01); *H05K 3/46* (2013.01); *H01L 21/568* (2013.01);
(Continued)

(58) Field of Classification Search
CPC ........... H01L 21/28247; H01L 23/3171; H01L 21/561; H01L 21/78; H01L 23/49822; H01L 23/49827; H01L 23/5389; H01L 24/19; H05K 1/188; H05K 1/115; H05K 1/185; H05K 3/46
USPC ........ 257/626, E23.132, 686, 700, 773, 774, 257/E21.502, 685, 723, 725, 776, 777
See application file for complete search history.

(56) References Cited

U.S. PATENT DOCUMENTS

| 7,312,536 B2 | 12/2007 | Yamano et al. |
| 2003/0137045 A1 * | 7/2003 | Sugaya ................. H01L 21/56 257/701 |

(Continued)

FOREIGN PATENT DOCUMENTS

| CN | 1819160 A | 8/2006 |
| CN | 101192544 A | 6/2008 |

*Primary Examiner* — Steven T Sawyer
(74) *Attorney, Agent, or Firm* — Christensen, Fonder, Dardi & Herbert PLLC

(57) ABSTRACT

An active chip package substrate and a method for preparing the same. The active chip package substrate includes: a core board; at least one upper active chip, embedded in the core board and having an active surface facing toward a lower surface of the core board, the upper active chip being an active bare chip; and at least one lower active chip, embedded in the core board and having an active surface facing toward an upper surface of the core board, the lower active chip being an active bare chip.

14 Claims, 8 Drawing Sheets

(51) Int. Cl.

| | |
|---|---|
| *H01L 23/538* | (2006.01) |
| *H01L 21/56* | (2006.01) |
| *H01L 23/00* | (2006.01) |
| *H01L 23/498* | (2006.01) |
| *H01L 21/78* | (2006.01) |
| *H01L 25/16* | (2006.01) |
| *H01L 25/00* | (2006.01) |
| *H05K 1/11* | (2006.01) |
| *H05K 3/46* | (2006.01) |

(52) U.S. Cl.
CPC ........... *H01L 2224/04105* (2013.01); *H01L 2224/24135* (2013.01); *H01L 2224/24137* (2013.01); *H01L 2224/32225* (2013.01); *H01L 2224/92144* (2013.01); *H01L 2924/12042* (2013.01); *H05K 3/4652* (2013.01); *H05K 2201/0137* (2013.01); *H05K 2201/0141* (2013.01); *H05K 2201/0154* (2013.01); *H05K 2201/09509* (2013.01)

(56) References Cited

U.S. PATENT DOCUMENTS

| | | | |
|---|---|---|---|
| 2007/0084628 A1* | 4/2007 | Chang | H01L 23/3121 |
| | | | 174/260 |
| 2007/0290366 A1 | 12/2007 | Cheng | |
| 2010/0142170 A1* | 6/2010 | Kim | H01L 21/6835 |
| | | | 361/762 |

* cited by examiner

US 9,730,329 B2

ACTIVE CHIP PACKAGE SUBSTRATE AND METHOD FOR PREPARING THE SAME

CROSS-REFERENCE TO RELATED APPLICATION(S)

This application is a U.S. National Phase Application of International Application No. PCT/CN2011/083118, filed on Nov. 29, 2011, entitled "ACTIVE CHIP PACKAGE SUBSTRATE AND METHOD FOR PREPARING THE SAME," which is incorporated herein by reference in its entirety.

TECHNICAL FIELD

The present disclosure relates to the field of system packaging in the microelectronics industry, and in particular, to an active chip package substrate and a method for preparing the same.

BACKGROUND

Modern portable electronic products propose a higher requirement of microelectronic packaging. With the continuous pursuit of lighter weight, thinner and smaller dimensions, higher reliability, and lower power consumption, microelectronic packaging evolves toward a packaging form with a higher density and a smaller dimension. Microelectronic packaging keeps evolving from "with package" and "less package" to "package-less". Therefore, "Direct Chip Attach" (DCA) technology is drawing more attention. The DCA technology is a packaging technology with the highest packaging efficiency, and it does NOT perform packaging, but instead bonds a chip into a printed circuit board or a substrate directly. The advantages of DCA technology are to provide better electrical performance, more direct heat-dissipation-channels, a lighter weight, a smaller dimension, and a lower cost.

Conventionally, these chips are welded and mounted on a surface of a substrate after they are packaged. Now, these active bare chips are to be embedded into the substrate directly, and its complexity is obvious. Because an internal configuration and structure of a chip is much more complex than those of a passive element, it is much more difficult to embed the chip than the passive element. During the procedure of embedding a chip, because the thickness of the chip is much thicker than a thin film passive element, the chip is first to be planarized and thinned, and then the procedure of embedding is performed. In addition, the number of interconnect points of the chip within the substrate is much greater than that of a passive element. The fineness requirement of the wires for these interconnect points is much higher, and most of them are at "the micrometer level", or even "the nanometer level", all of which cause troubles in chip embedding.

Currently, there are two main ways for embedding a chip. One of them is the Occam process, and the other is the Chip in Polymer process. Both of these processes are based on the following procedure: chips are first disposed on a very thin core substrate, and a board is "grown" around these chips. Therefore, the embedding of a chip has the following advantages: first, no solder is needed during assembly, in other words, reflow is needed no more, and a number of defects related directly or indirectly to solder and reflow will disappear; second, reduction of interconnection distance will improve the performance, and in most of these process designs, there will be no lead, and instead, devices are interconnected by microvias and traces wherein the device may be disposed on top of another device; last, a substrate made by this process has a higher inherent strength and can withstand more shocks and vibrations. Furthermore, such a board may be referred to as a package substrate, a substrate having a function of packaging.

The Chinese patent, CN101192544A, utilizes a supporting board with cavities to implement back-to-back embedding of two chips into the supporting boards. As shown in FIG. 1A, two holes are formed in advance in two supporting boards 21a and 21b. Chips 233a and 233b are disposed in the preset holes, and dielectric 221a and 221b are used to embed the chips 233a and 233b into the holes. At last, the two supporting boards 21a and 21b are connected face to face via a dielectric layer 26. The process is comparatively complex because the holes are needed to be formed in advance in the supporting boards and the stacking and laminating are performed after the chips are embedded into the preset holes, respectively.

U.S. Pat. No. 7,663,249 B2 discloses a chip packaging structure and a method for manufacturing the same. As shown in FIG. 1B, this method utilizes flip chip technology to connect packaged chips 108 and 208 to two substrates, respectively. First, one layer of dielectric layer 120 is laminated on one substrate connected to the packaged chip 108, and then another substrate connected to the flipped packaged chip 208 is laminated in a facedown manner on the dielectric layer 120. After that, the substrates on both sides are removed, and therefore multiple packaged chips are embedded. However, in the above patent, because the chip is flipped and connected to the substrate and the dielectric layer is laminated, the gap (i.e., B in FIG. 1B) between bumps of the chip may not completely filled up by the dielectric layer when there are a huge number of bumps and the spacing therebetween is small, resulting in air bubbles. Furthermore, because the chips are already packaged and the dimensions of the chips per se are large, the packaging structure will be comparatively large as well and it is difficult to reduce the size of the package.

SUMMARY

With regard to the above one or more problems, the present disclosure provides an active chip package substrate and a method for preparing the same. The simultaneous embedding of multiple chips and high performance and compact and lightweight of circuits are achieved while the efficiency and degree of integration are improved.

According to an aspect of the present disclosure, the present disclosure provides an active chip package substrate. This active chip package substrate comprises: a core board; at least one upper active chip embedded into the core board and having an active surface facing toward the lower surface of the core board, the upper active chip being an active bare chip; and at least one lower active chip embedded into the core board and having an active surface facing toward the upper surface of the core board, the lower active chip being an active bare chip.

According to another aspect of the present disclosure, the present disclosure provides a method for preparing an active chip package substrate. This method comprises steps of: bonding an active surface of at least one upper active chip to an upper supporting board by a temporary bonding film; bonding an active surface of at least one lower active chip to a lower supporting board by a temporary bonding film, both of the upper active chip and the lower active chip being active bare chips, both of the active surfaces of the upper active chip and the lower active chip facing toward outside; adding at least one layer of prepreg dielectric sheet between the upper supporting board and the lower supporting board, the total thickness of the prepreg dielectric sheet being greater than the thickness of the upper active chip or the thickness of the lower active chip; bonding the upper supporting board, the at least one layer of prepreg dielectric sheet, and the lower supporting board by thermal-compression such that the at least one upper active chip and the at least one lower active chip are embedded into the prepreg dielectric and the at least one layer of prepreg dielectric sheet forms a core board after cured; removing the temporary bonding films on both sides of the core board by de-bonding accompanied by removing the upper supporting board and the lower supporting board, such that the at least one upper active chip and the at least lower active chip are packaged into the core board to form the active chip package substrate.

From the above solutions, the active chip package substrate and the method for preparing the same according to the present disclosure have advantageous effects as follows:

(1) the present disclosure utilizes active bare chips to be embedded directly, and therefore the occurrence of bumps and air bubbles therebetween when packaged chips are embedded are avoided;
(2) in the present disclosure, because the active bare chips are not subject to packaging but subject to the thinning process to achieve miniature and lightweight package structure, the manufacturing process of the substrate is simplified and production efficiency is improved;
(3) the present disclosure achieves the simultaneous embedding of multiple active chips into both sides of the substrate, improving the degree of integration; meanwhile, a great deal of freedom and space are provided on both sides of the substrate, and multi-layer wiring can be performed continuously, thereby improving the process quality and reliability of electrical connection; and
(4) the method adopted by the whole process of the present disclosure may be compatible with the planar semiconductor process, and the package and the substrate may be made integrally.

BRIEF DESCRIPTION OF THE DRAWINGS

FIGS. 3a-3e are a manufacturing process of making passivation layers for active chips and thinning and cutting the chips in a method for packaging a chip in accordance with an embodiment of the present disclosure, wherein:

FIG. 3a is a whole wafer sectional view of multiple active chips with metal electrodes;

FIG. 3b is a whole wafer sectional view of the multiple active chips with first passivation layer;

FIG. 3c is a whole wafer sectional view of the multiple active chips with a second passivation layer;

FIG. 3d is a whole wafer sectional view of the multiple active chips with a thinned and flattened back;

FIG. 3e is a single active chip sectional view after cutting;

FIGS. 4a-4h are a manufacturing process of embedding active chips into a dielectric core board and preparing outside patterns in a method for packaging a chip in accordance with an embodiment of the present disclosure, wherein:

FIG. 4a is a sectional view of connecting an upper active chip to an upper supporting board;

FIG. 4b is a sectional view of connecting a lower active chip to a lower supporting board;

FIG. 4c is a schematic diagram of bonding the upper supporting board, a layer of prepreg dielectric sheet, and the lower supporting board by thermal-compression;

FIG. 4d is a module sectional view of the embedded upper and lower active chips after the thermal-compress bonding;

FIG. 4e is a module sectional view after the upper supporting board and the lower supporting board are removed by de-bonding;

FIG. 4f is a module sectional view of making a wiring dielectric layer and a metal layer on both sides of the dielectric core board;

FIG. 4g is a module sectional view of making first outer circuits on both sides of the dielectric core board;

FIG. 4h is a module sectional view of making second outer circuits on both sides of the dielectric core board;

FIGS. 5a-5h are a manufacturing process of embedding active chips and passive elements into a dielectric core board simultaneously and preparing outside patterns in a method for packaging a chip in accordance with an embodiment of the present disclosure, wherein:

FIG. 5a is a sectional view of connecting two upper active chips to an upper supporting board;

FIG. 5b is a sectional view of connecting a passive element to a lower supporting board;

FIG. 5c is a schematic diagram of bonding the upper supporting board, a layer of prepreg dielectric sheet, and the lower supporting board by thermal-compression;

FIG. 5d is a module sectional view of the embedded active chips and the embedded passive elements after the thermal-compress bonding;

FIG. 5e is a module sectional view after the upper supporting board and the lower supporting board are removed by de-bonding;

FIG. 5f is a module sectional view of making a wiring dielectric layer and a metal layer on both sides of the dielectric core board;

FIG. 5g is a module sectional view of making first outer circuits on both sides of the dielectric core board;

FIG. 5h is a module sectional view of making second outer circuits on both sides of the dielectric core board.

DETAILED DESCRIPTION

Figure 1A:
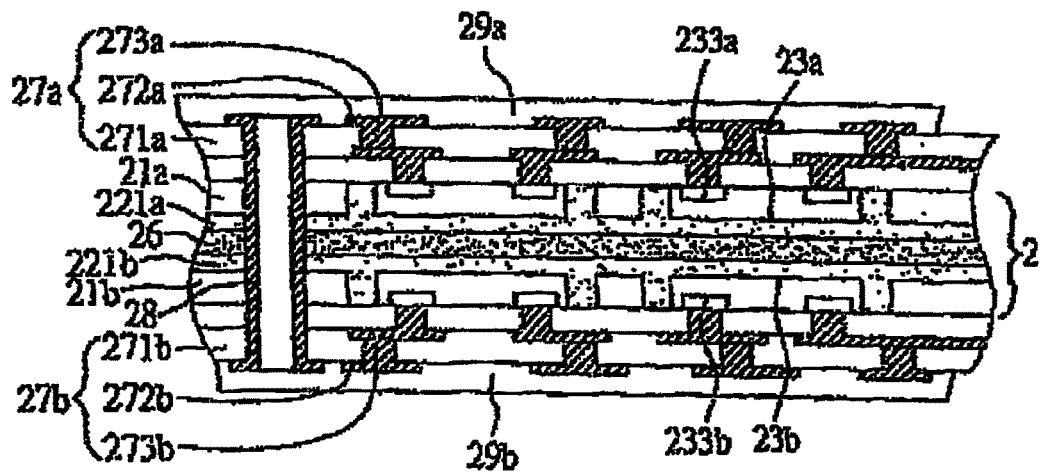
FIG. 1A is a schematic diagram of a chip packaging structure 1 of the prior art.
Figure 1B:
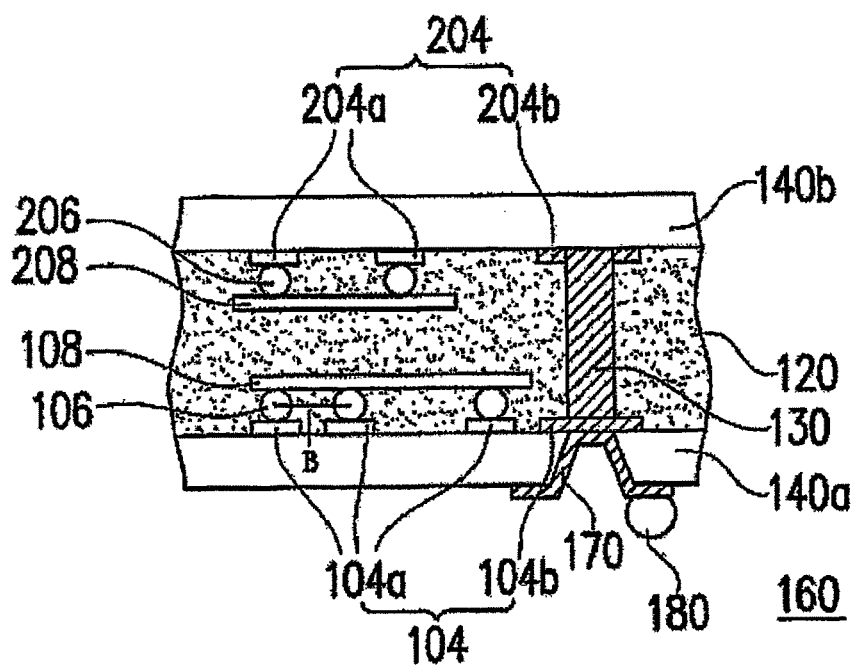
FIG. 1B is a schematic diagram of a chip packaging structure 2 of the prior art.

To make the objectives, solutions, and advantages of the present disclosure more obvious, the present disclosure is further illustrated in details in conjunctions with specific embodiments with reference to the drawings. It is to be noted that although examples of parameters comprising specific values may be provided by the present disclosure, one skilled in the art may appreciate that the parameters may not necessarily be equal to the respective values exactly, but may be approximately equal to the values within an acceptable error tolerance or under design constraints. To facilitate the explanation, first, various components related to the present disclosure are numbered as follows:

100—upper active chips; 101—metal electrodes of the upper active chips;

102—a first passivation layer on the upper active chips with windows exposing the electrodes;

103—a second passivation layer on the upper active chips;
104—temporary bonding films;
105—an upper supporting board;
106—blind holes from the electrodes of the upper active chips;
200—lower active chips; 201—metal electrodes of the lower active chips;
202—a first passivation layer on the lower active chips with windows exposing the electrodes;
203—a second passivation layer on the lower active chips;
204—temporary bonding films;
205—a lower supporting board;
206—blind holes from the electrodes of the lower active chips;
300—a core board/prepreg dielectric;
301, 302, 307, and 308—wiring dielectric layers;
303, 304, 309, and 310—metal layers;
305—through holes;
400—a passive element;
401—metal electrodes on the passive element; and
406—blind holes from the electrodes of the passive element.

In an exemplary embodiment of the present disclosure, an active chip package substrate is provided. FIG. 4e is a schematic diagram of an active chip package substrate in accordance with an embodiment of the present disclosure. As shown in FIG. 4e, this active chip packaging substrate comprises: a core board 300; at least one upper active chip 100 and at least one lower active chip 200, wherein both of the upper active chip 100 and the lower active chip 200 being thinned active bare chips; the upper active chip 100 embedded into the core board 300 and having an active surface facing toward the lower surface of the core board 300; the lower active chip 200 embedded into the core board 300 and having an active surface facing toward the upper surface of the core board 300. Of course, this substrate may further comprise: at least one passive element also embedded into the core board 300 and having an active surface facing toward the upper surface or the lower surface of the core board 300.

In this embodiment, the core board is one or more layers of prepreg dielectrics cured by thermal-compression, and its material may be but not limited to following materials: epoxy resin, polyimide, bismaleimide-triazine resin, liquid crystal polymer, ABF film (Ajinomoto Build-up Film), polyphenylene ether, Teflon, parylene, or benzocyclobutene. In addition, it is to be noted that the term "active chip" herein refers to "active bare chip" and the term "passive element" refers to "passive bare chip", unless otherwise indicated, for smoothing the sentences.

In this embodiment, both of the upper active chip and the lower active chip are bare chips without packages, and their electrodes on the active surfaces are exported through blind micro holes, thereby air bubbles generated by the filling of the dielectric between the bumps of the chips when the packaged chips are embedded into the substrate may be prevented. Meanwhile, because the active bare chip is not packaged but embedded into the substrate directly, the preparation process of a package substrate is greatly simplified and the production efficiency is improved.

As a complete substrate, there should be corresponding circuit patterns and blind holes or through holes for connecting the circuit patterns to the above active bare chips on both sides of the substrate. Therefore, in a preferred embodiment of the present disclosure, an active chip package substrate is also provided. As shown in FIG. 4g, in this embodiment, each of an upper active chip 100 and a lower active chip 200 comprises: a first passivation layer and a second passivation layer. Each of the upper surface and the lower surface of the active chip package substrate comprises: a wiring dielectric layer and an outer circuit pattern. The first passivation layers are formed on the active surfaces of the active bare chips and have windows at the locations of the active surface electrodes of the active bare chips; the second passivation layers are formed on the surfaces of the first passivation layers and the window locations of the active surface electrodes of the active bare chips, and their surfaces facing toward outside are planes; the second passivation layer of the upper active chip is coplanar with the upper surface of the core board; and the second passivation layer of the lower active chip is coplanar with the lower surface of the core board. The wiring dielectric layers are formed on the upper surface and the lower surface of the core board; the outer circuit patterns are formed on top of the dielectric layers, and connected to the electrodes on the active surfaces of the active chips through the metallized blind holes which pass through the dielectric layers and the second passivation layers. Furthermore, there may be multiple layers of the wiring dielectric layers and the outer circuit patterns on both sides of the core board.

Figure 2:
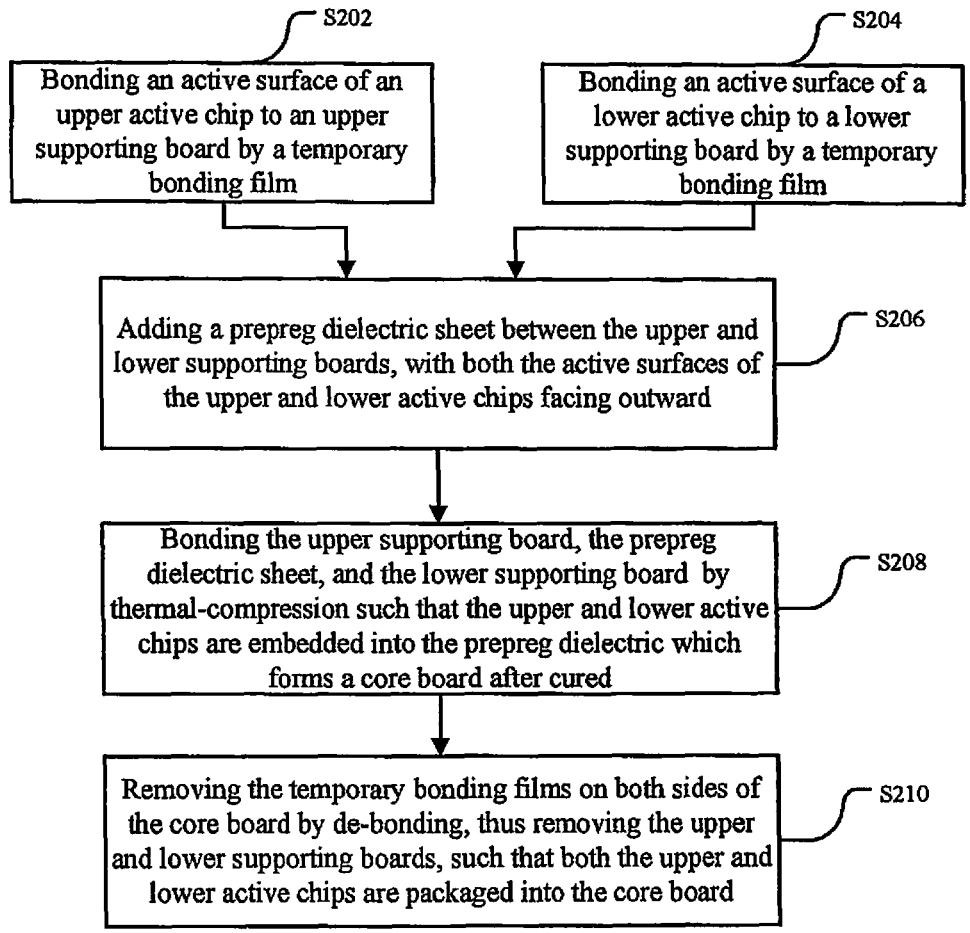
FIG. 2 is a flow chart showing a method for packaging a chip in accordance with an embodiment of the present disclosure.

In this embodiment, both of the first passivation layer and the second passivation layer utilize a material with a relatively low surface activity. The purpose of the passivation is to lower the surface activity and remain a stable characteristic. There are a large number of unsaturated bonds on a surface of a semiconductor, and activity thereof is high. Adding a passivation layer may reduce dangling bonds on the surface, and in turn reduce surface density of states. The first passivation layer typically utilizes some thermal oxidized film layer which may block movable ions, vapors, contaminations, etc. and may prevent scratching and radiations, and the thermal oxidized film layer comprises a material, such as, silicon dioxide, silicon nitride, or aluminum oxide. Here, the second passivation layers are used to protect the first passivation layers, and typically utilize a polymeric material, such as, Polyimide. This embodiment achieves the simultaneous embedding of multiple active chips into both sides of the substrate, improving the degree of integration; meanwhile, a great deal of freedom and space are provided on both sides of the substrate, and multi-layer wiring can be performed continuously, thereby improving the process quality and reliability of electrical connection;

According to another aspect of the present disclosure, a method for packaging active chips is further provided. FIG. 2 is a flow chart of a method for packaging a chip in accordance with an embodiment of the present disclosure. As shown in FIG. 2, this embodiment comprises:

At step S202, an active surface of an upper active chip is bonded to an upper supporting board by a temporary bonding film, this upper active chip being an active bare chip;

At step S204, an active surface of a lower active chip is bonded to a lower supporting board by a temporary bonding film, this lower active chip being an active bare chip;

At step S206, both of the active surfaces of the upper active chip and the lower active chip face toward outside, and least one layer of prepreg dielectric sheet is added between the upper supporting board and the lower supporting board;

In this step, the total thickness of the prepreg dielectric sheet is greater than the thickness of the upper active chip or the thickness of the lower active chip, preferably, the total thickness of the prepreg dielectric sheet is greater than the total thickness of the upper active chip and the lower active chip. The upper active chip and the lower active chip may be disposed oppositely (as shown in FIG. 4d), and may be disposed to be separated by a preset distance. In the case where the upper active chip and the lower active chip are disposed to be separated by a preset distance, the total thickness of the prepreg dielectric sheet may be reduced appropriately, thereby facilitating the device integration.

At step S208, the upper supporting board, the prepreg dielectric sheet, and the lower supporting board are bonded by thermal-compression such that the upper active chip and the lower active chip are embedded into the prepreg dielectric sheet and the prepreg dielectric sheet forms a core board after cured;

At step S210, the temporary bonding film on both sides of the core board are removed by de-bonding accompanied by removing the upper supporting board and the lower supporting board, such that both of the upper active chip and the lower active chip are packaged into the core board.

Based on the above method embodiment, other two method embodiments of the present disclosure will be given below. It is to be noted that features of both of the following two embodiments are applicable to the method embodiments and the apparatus embodiments, and technical features presented in the same or different embodiments may be combined if no conflict exists therebetween, unless otherwise indicated.

In yet another exemplary embodiment of the present disclosure, a method for packaging an active chip is further provided. This method for packaging a chip is divided into three stages: (1) a stage where passivation layers for the active chips are made; (2) a stage where the active chips are embedded; and (3) a stage where outer circuit patterns are prepared. These three stages will be described below, respectively.

The first stage: the stage where the passivation layers are made for the active chips. FIGS. 3a-3e are a manufacturing process of making passivation layers for active chips and thinning and cutting the chips in a method for packaging a chip in accordance with an embodiment of the present disclosure.

Figure 3A:
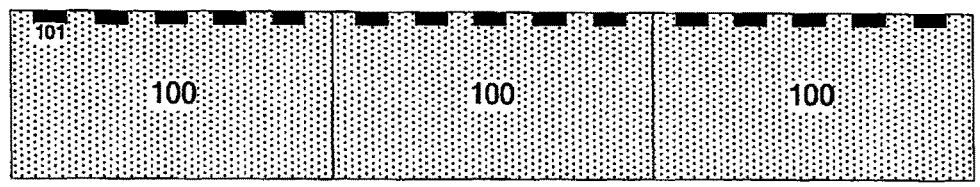
Figure 3B:
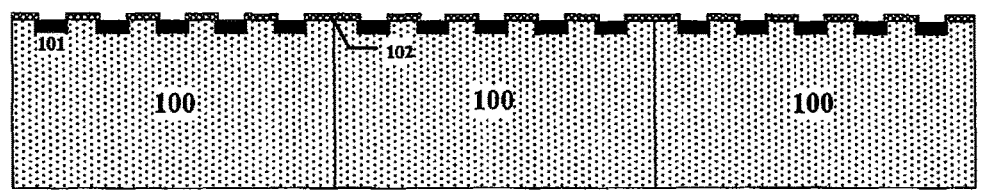
Figure 3C:
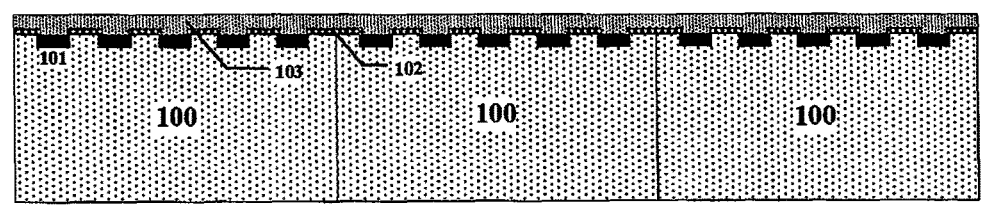
Figure 3D:
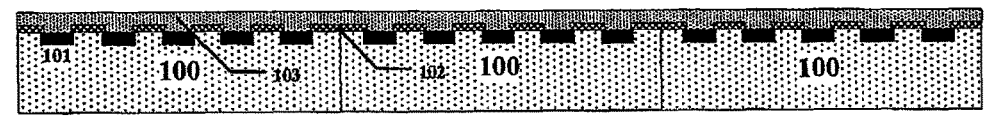
Figure 3E:
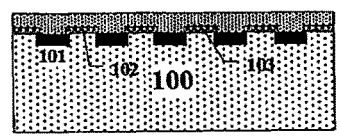

At step S302, referring to FIG. 3a, a wafer of 4" or 8" is selected. Circuit patterns are already made on the wafer and the wafer has multiple active chips 100, each having a plurality of electrodes 101;

At step S304, referring to FIG. 3b, a first passivation layer 102 is made on the wafer with circuit patterns made. Its material may be $Si_3N_4$ or silicon dioxide. The first passivation layer 102 is windowed to expose the electrodes 101 of the active chips 100;

At step S306, referring to FIG. 3c, a second passivation layer 103 is made on the passivation layer 102 with windows. Its material may be organic polymeric material, such as, polyimide. This passivation layer 103 will cover the electrodes 101 of the active chips 100 (i.e. filling the windows of the first passivation layer); the upper surface of this passivation layer is a plane;

At step S308, referring to FIG. 3d, the back of the wafer is thinned and planarized by the chemical mechanical polishing technology to reduce the thickness of the wafer down to about 200 μm or lower, the wafer having the first passivation layer 102 and the second passivation layer 103;

At step S310, referring to FIG. 3e, the wafer is cut into multiple active chips 100 by mechanical means, each active chip 100 having electrodes 101 and passivation layers 102 and 103.

It is to be noted that the active chip subject to this procedure is still a bare chip.

The second stage: a stage where the active chips are embedded. FIGS. 4a-4h are a manufacturing process of embedding active chips into a dielectric core board in a method for packaging a chip in accordance with an embodiment of the present disclosure.

Figure 4A:
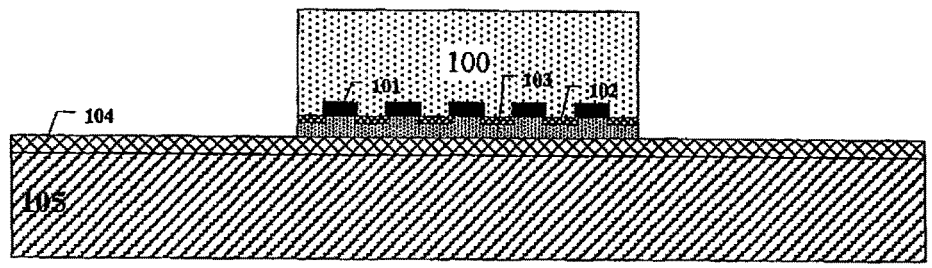
Figure 4B:
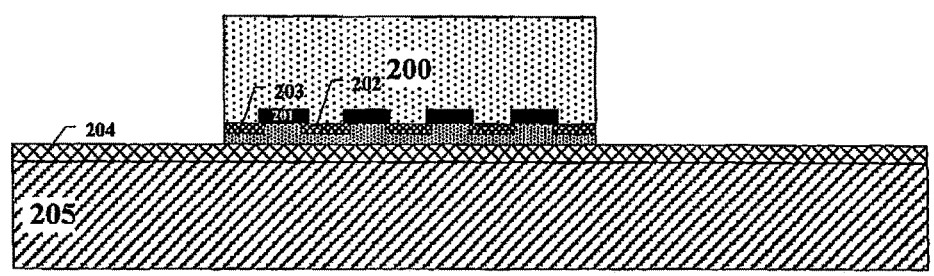
Figure 4C:
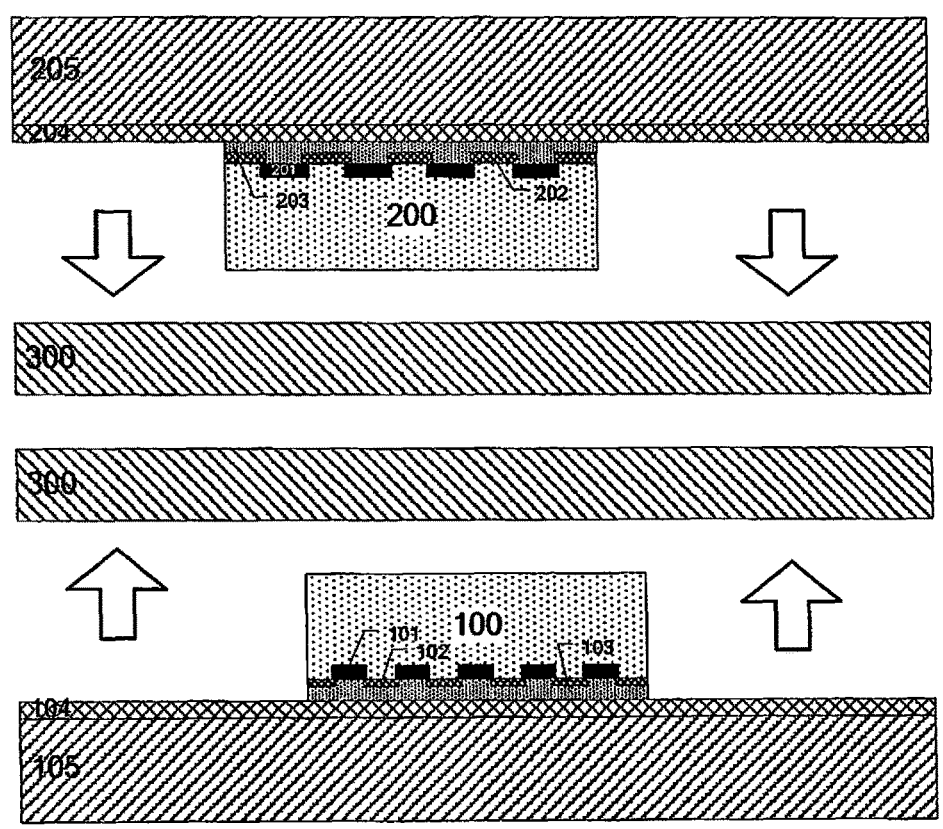
Figure 4D:
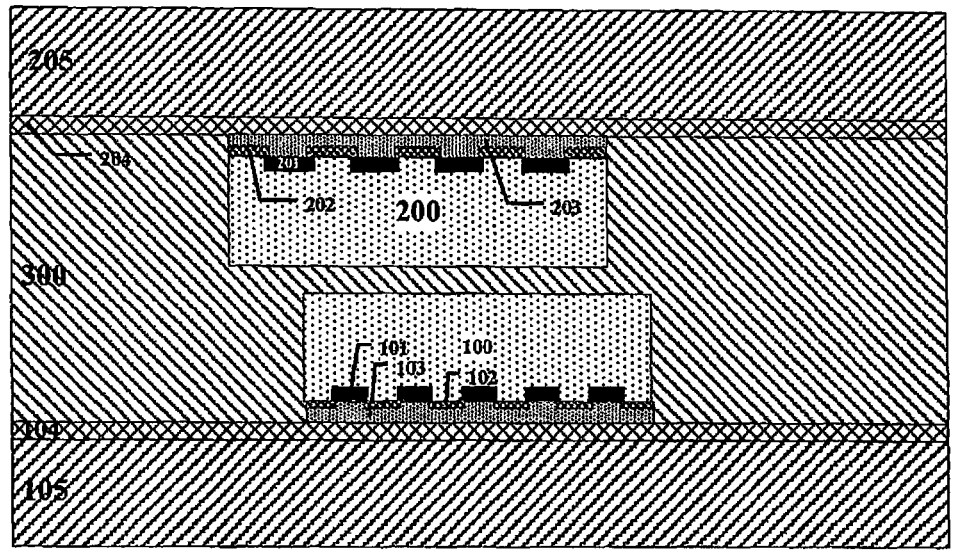
Figure 4E:
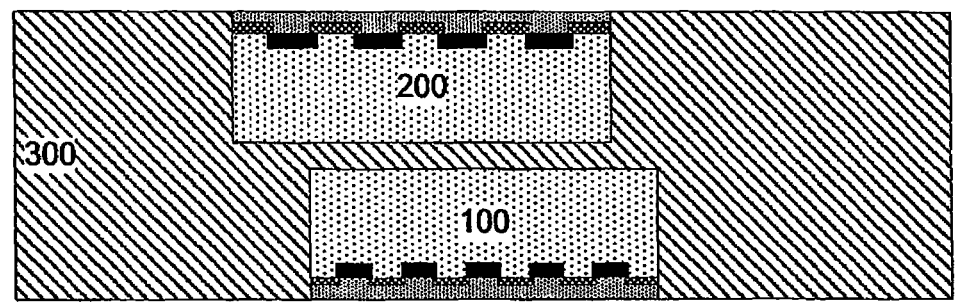

At step S412, referring to FIG. 4a, glass, metallic material, or organic material, such as, epoxy resin, bismaleimide-triazine resin, liquid crystal polymer, etc., is selected as the upper supporting board. At least one upper active chip 100 is preconfigured and bonded by a temporary bonding film 104, the active surface of the upper active chip 100 being connected to the upper supporting board 105, and the upper active chip 100 being an active bare chip;

At step S414, referring to FIG. 4b, glass, metallic material, or organic material, such as, epoxy resin, bismaleimide-triazine resin, liquid crystal polymer, etc., is selected as the lower supporting board. At least one lower active chip 200 is preconfigured and bonded by a temporary bonding film 204, the lower active chip 200 being manufactured with reference to FIGS. 3a-3e, the active surface of the lower active chip 200 being connected to the lower supporting board 205, and the lower active chip 200 being an active bare chip;

At step S416, referring to FIG. 4c, organic material, such as, epoxy resin, bismaleimide-triazine resin, polyimide, or liquid crystal polymer, etc., is selected as the prepreg dielectric layer, and its thickness is about 25 to 500 μm. There are one or more layers of prepreg dielectric (two layers in FIG. 4c). The upper supporting board 105 bonded with the upper active chip 100, the lower supporting board 205 bonded with the lower active chip 200, and the prepreg dielectric layer 300 are bonded by the vacuum thermal compression bonding method, and the laminated structure thereof comprises, from top to bottom, the lower supporting board bonded with the lower active chip, the organic dielectric layer, and the upper supporting board bonded with the upper active chip.

Positioning is needed to be carried out during the manufacture. The upper supporting board and the lower supporting board configured with at least one active chip are aligned, respectively, and an organic dielectric layer is added therebetween and the vacuum thermal compression bonding is performed. The bonder has a camera which may be used for aligning. The device after the vacuum thermal compression bonding is shown in FIG. 4d. The upper active chip and the lower active chip are embedded into the prepreg dielectrics, and one or more layers of the prepreg dielectric sheets form an integral core board after cured.

At step S418, referring to FIG. 4e, the temporary bonding film and the core board are separated by the de-bonding method, thereby the temporary bonding film, the upper supporting board and the lower supporting board on both sides of the core board into which the upper active chip and the lower active chip are embedded may be removed.

Figure 4F:
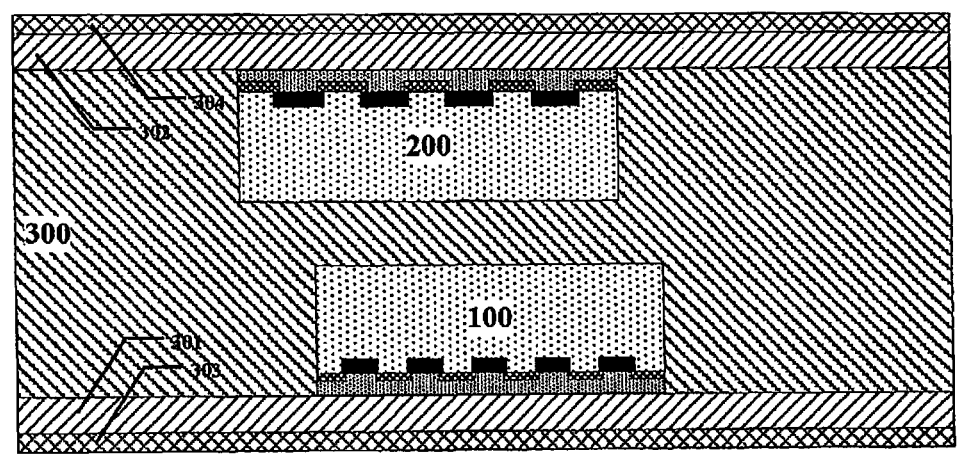
Figure 4G:
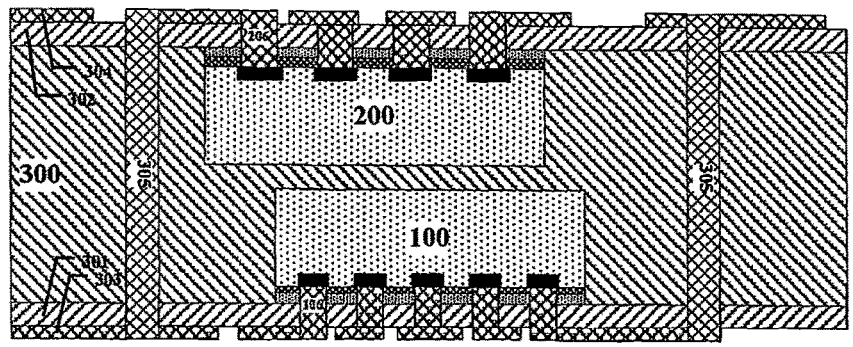
Figure 4H:
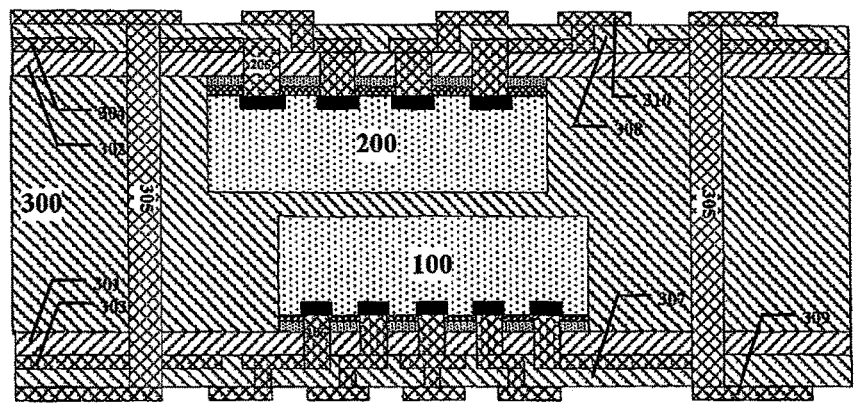

The third stage: a stage where the outer circuit patterns are prepared. FIGS. 4f-4h are a manufacturing process of preparing outer circuit patterns on both sides of the core board in a method for packaging a chip in accordance with an embodiment of the present disclosure.

At step S420, referring to FIG. 4f, the lamination process is performed on both sides of the core board into which the two active chips are embedded to make the wiring dielectric layers 301, 302 and the metal layers 303, 304 simultaneously;

At step S422, referring to FIG. 4g, the manufacture of the first layers of outer circuit is performed on the core board into which the two active chips are embedded;

The blind holes are made by laser drilling, and the through holes are prepared by mechanical drilling. The holes are metallized and filled up by electroless deposition of copper and electroplating. Conductive blind holes 106 are formed in the blind holes, such that this outer wiring layer may be electrically connected to the electrodes 101 of the upper active chip 100; conductive blind holes 206 are formed in the blind holes, such that this wiring layer may be electrically connected to the electrodes 201 of the lower active chip 200; and conductive through holes 305 are formed in the through holes, such that the upper and lower wiring layers may be electrically connected.

At step S424, referring to FIG. 4h, the manufacture of the second outer circuits is performed on the above module, into which the at least two active chips are embedded, having the first outer circuit;

The manufacture of the second wiring layers is performed simultaneously on both sides of the module by the circuit adding layer process. Of course, the layers can be added continuously as required. Therefore, the process quality and reliability of electrical connection are improved.

At this point, the description of the method for packaging an active chip according to this embodiment is completed.

In another exemplary embodiment of the present disclosure, a method for packaging an active chip is further provided. This embodiment differs from the first embodiment in that active chips and passive elements are embedded simultaneously in the second stage. This method for packaging a chip is also divided into three stages: (1) a stage where passivation layers for the active chips are made; (2) a stage where the active chips/passive elements are embedded; and (3) a stage where outer circuit patterns are prepared. These three stages will be described below, respectively.

The first stage: the stage where the passivation layers are made for the active chips. This stage is same as that in the above embodiment and the description thereof is thus omitted. The related description of FIGS. 3a-3e may be referred to.

The second stage: a stage where the active chips/passive elements are embedded. FIGS. 5a-5e are a manufacturing process of embedding active chips and passive elements into a dielectric core board simultaneously in a method for packaging a chip in accordance with an embodiment of the present disclosure.

Figure 5A:
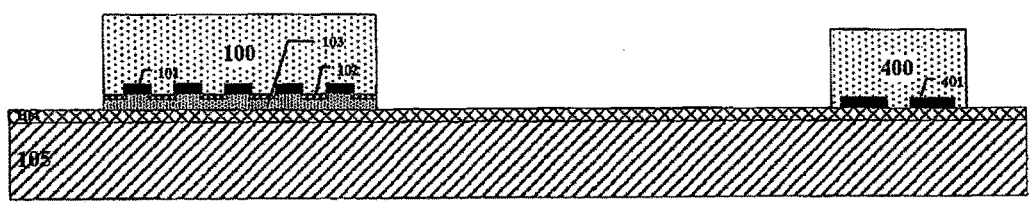
Figure 5B:
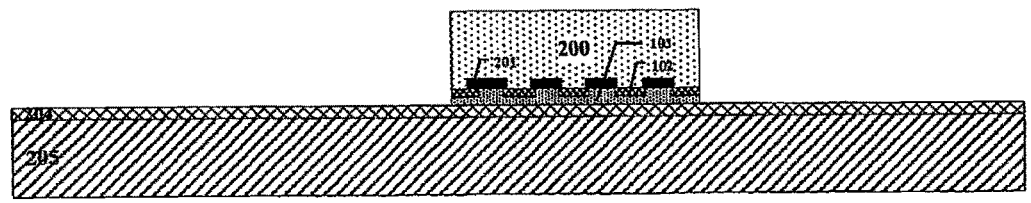
Figure 5C:
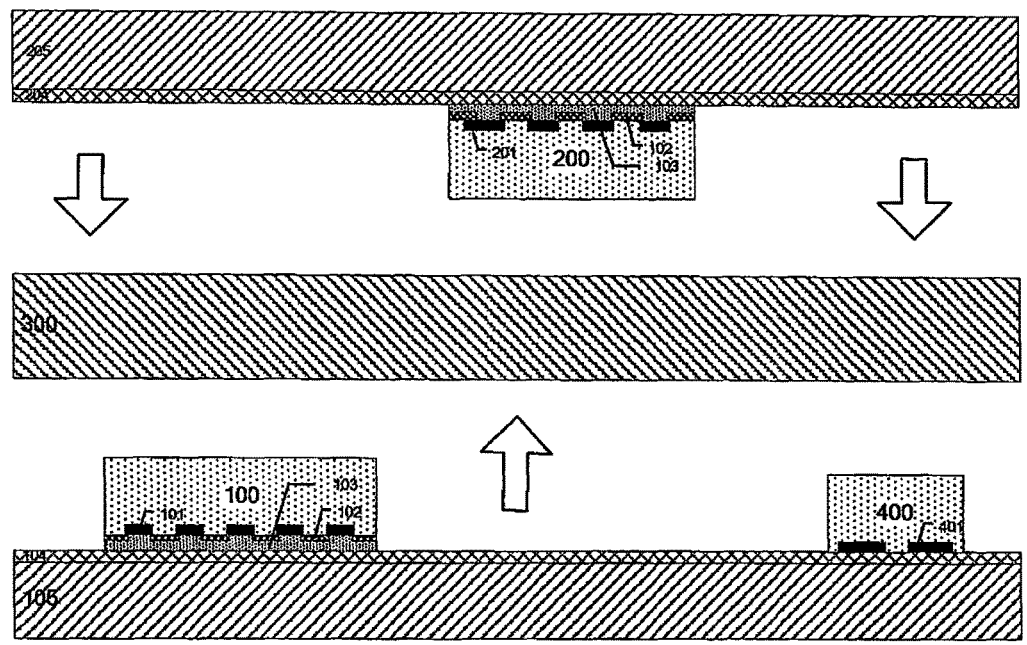

At step S512, referring to FIG. 5a, glass, metallic material, or organic material, such as, epoxy resin, bismaleimide-triazine resin, liquid crystal polymer, etc., is selected as the upper supporting board. At least one upper active chip 100 and passive element 400 are preconfigured and bonded by a temporary bonding film 104, the active surface of the upper active chip 100 being connected to the upper supporting board 105, the active surface of the passive element 400 being connected to the upper supporting board 105, and the upper active chip being an active bare chip;

At step S514, referring to FIG. 5b, glass, metallic material, or organic material, such as, epoxy resin, bismaleimide-triazine resin, liquid crystal polymer, etc., is selected as the lower supporting board. At least one lower active chip is preconfigured and bonded by a temporary bonding film 204, the lower active chip 200 being manufactured with reference to FIGS. 3a-3e, the active surface of the lower active chip 200 being connected to the lower supporting board 205, and the lower active chip being an active bare chip;

At step S516, referring to FIG. 5c, organic material, such as, epoxy resin, bismaleimide-triazine resin, polyimide, or liquid crystal polymer, etc., is selected as the dielectric layer, and its thickness is about 25 to 500 μm.

Figure 5D:
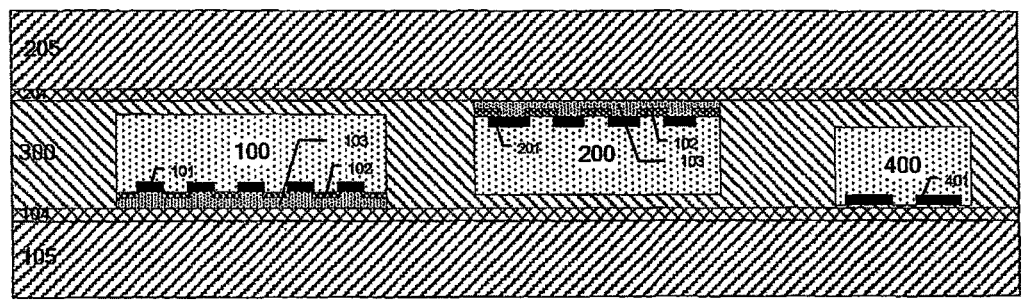

The upper supporting board 105 bonded with the upper active chip 100 and the passive element 400, the lower supporting board 205 bonded with the lower active chip 200, and the organic dielectric layer 300 are bonded by the vacuum thermal compression bonding method, and the laminated structure thereof comprises, from top to bottom, the lower supporting board bonded with the lower active chip, the organic dielectric layer, and the upper supporting board bonded with the upper active chip and the passive element. Positioning is needed to be carried out during the manufacture. The upper supporting board configured with at least one active chip and passive element and the lower supporting board configured with at least one active chip are aligned, respectively, and an organic dielectric layer is added therebetween and the thermal compression bonding is performed. The bonder has a camera which may be used for aligning. The device after the thermal compression bonding is shown in FIG. 5d. The upper active chip, the lower active chip, and the passive element are embedded into the prepreg dielectrics, and the prepreg dielectric sheets form a core board after being cured.

Figure 5E:
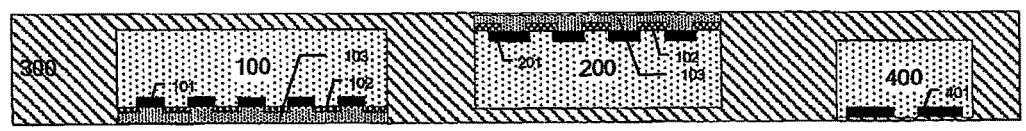

At step S518, referring to FIG. 5e, the temporary bonding films and the core board are separated by the de-bonding method, thereby the temporary bonding film, the upper supporting board and the lower supporting board on both sides of the structure into which at least two active chips and at least one passive element are embedded may be removed.

Figure 5F:
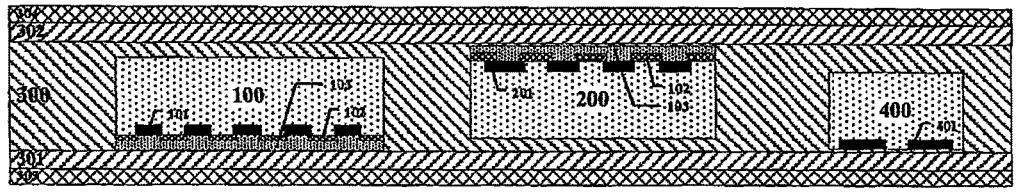
Figure 5G:
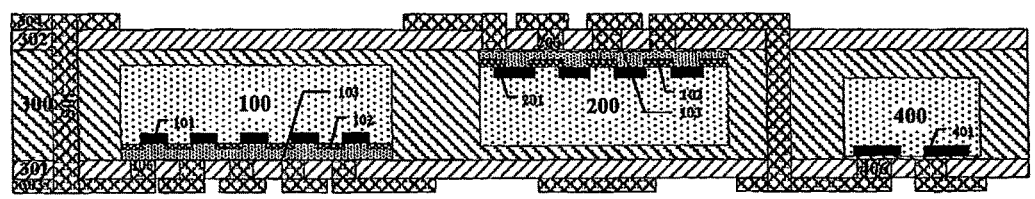
Figure 5H:
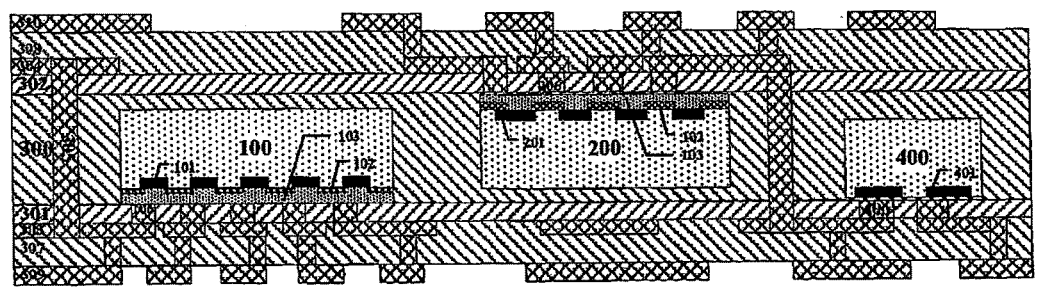

The third stage: a stage where the outer circuit patterns are prepared. FIGS. 5f-5h are a manufacturing process of preparing outside patterns on both sides of the core board in a method for packaging a chip in accordance with an embodiment of the present disclosure. The manufacturing process of the stage of preparing outer circuit patterns in a method for packaging a chip in accordance with this embodiment is described below.

At step S520, referring to FIG. 5f, the lamination process is performed on both sides of the core board into which the at least two active chips and at least one passive element are embedded to make the wiring dielectric layers 301, 302 and the metal layers 303, 304 simultaneously;

At step S522, referring to FIG. 5g, the manufacture of the first layers of outer circuits is performed on the core board, into which the at least two active chips and at least one passive element are embedded, having one layer of outer wiring layer;

The blind holes are made by laser drilling, and the through holes are prepared by mechanical drilling. The holes are metallized and filled up by electroless deposition of copper and electroplating. Conductive blind holes 106 are formed in the blind holes, such that this outer wiring layer may be electrically connected to the electrodes 101 of the upper active chip 100; conductive blind holes 206 are formed in the blind holes, such that this wiring layer may be electrically connected to the electrodes 201 of the lower active chip 200; conductive blind holes 406 are formed in the blind holes, such that this wiring layer may be electrically connected to the electrodes 401 of the passive element 400; and conductive through holes 305 are formed in the through holes, such that the upper and lower wiring layers may be electrically connected.

At step S524, referring to FIG. 5h, the manufacture of the second outer circuits is performed on the above module, into which the at least two active chips and at least one passive element are embedded, having the first outer circuit;

The manufacture of the second wiring layer is performed simultaneously on both sides of the module by the circuit adding layer process. Of course, the layer can be added continuously as required. Therefore, the process quality and reliability of electrical connection are improved.

At this point, the description of the method for packaging a chip according to this embodiment is completed.

From the above solutions, the active chip package substrate and the method for preparing the same according to the present disclosure have advantageous effects as follows:

(1) the present disclosure utilizes active bare chips to be embedded directly, and therefore the occurrence of bumps and air bubbles therebetween when packaged chips are embedded are avoided;

(2) in the present disclosure, because the active bare chips are not subject to packaging but subject to the thinning process to achieve the miniature and lightweight of the package structure, the manufacturing process of the substrate is simplified and production efficiency is improved;

(3) the present disclosure achieves the simultaneous embedding of multiple active chips into both sides of the substrate, improving the degree of integration; meanwhile, a great deal of freedom and space are provided on both sides of the substrate, and multi-layer wiring can be performed continuously, thereby improving the process quality and reliability of electrical connection; and (4) the method adopted by the whole process of the present disclosure may be compatible with the planar semiconductor process, and the substrate may be made integrally.

The above specific embodiments provide a detailed description of the objectives, solutions, and advantageous effect of the present disclosure. It should be appreciated that the above description is merely some specific embodiments of the present disclosure, and not for the purpose of limiting the present disclosure. All modifications, substitutions, or improvements made within the spirit and principals of the present disclosure shall be embraced in the scope of the present disclosure.

We claim:

1. An active chip package substrate, comprising:
   a core board;
   at least one first active chip embedded into the core board and having an active surface facing toward the lower surface of the core board, the first active chip being an active bare chip; and
   at least one second active chip embedded into the core board and having an active surface facing toward the upper surface of the core board, the second active chip being an active bare chip,
   wherein each of the active bare chips comprises first passivation layers and second passivation layers:
   the first passivation layers are formed on the active surfaces of the active bare chips and have windows at the locations of the active surface electrodes of the active bare chips:
   the second passivation layers are formed on the surfaces of the first passivation layers and the window locations of the active surface electrodes of the active bare chips, and their surface facing toward outside are planes: and
   the second passivation layer of the first active chip is coplanar with the lower surface of the core board: and
   the second passivation layer of the second active chip is coplanar with the upper surface of the core board.

2. The active chip package substrate according to claim 1, wherein the core board is formed, by thermal compression curing, from any one of:
   epoxy resin, polyimide, bismaleimide-triazine resin, liquid crystal polymer, ABF film, polyphenylene ether, Teflon, parylene, or benzocyclobutene.

3. The active chip package substrate according to claim 1, wherein the material of the first passivation layers is silicon nitride, and the material of the second passivation layers is polyimide.

4. The active chip package substrate according to claim 1, further comprising:
   at least one passive chip embedded into the core board and having an active surface facing toward the upper surface or the lower surface of the core board.

5. The active chip package substrate according to claim 1, further comprising:
   wiring dielectric layers formed on the upper surface and the lower surface of the core board; and
   outer circuit patterns formed on top of the dielectric layers, and connected to the electrodes on the active surfaces of the active bare chips through the metalized blind holes which pass through the dielectric layers and the second passivation layers.

6. The active chip package substrate according to claim 5, wherein the multiple wiring dielectric layers and the outer circuit patterns on at least one side of the core board are stacked on each other.

7. A method for preparing an active chip package substrate, comprising steps of:
   making multiple continuous active chips on a wafer, each having a plurality of electrodes;
   forming first passivation layers on the wafer, the first passivation layers are windowed to expose the electrodes of the active chips;
   making second passivation layers on the first passivation layers with windows, the second passivation layers cover the first passivation layers and fills up the windows of the first passivation layers;
   cutting the wafer into multiple active chips, the upper surface of each active chip having the first passivation layer and the second passivation layer;
   bonding an active surface of at least one upper active chip to an upper supporting board by a temporary bonding film; bonding an active surface of at least one lower active chip to a lower supporting board by a temporary bonding film, both of the upper active chip and the lower active chip being selected from the multiple active chips and being active bare chips;
   both of the active surfaces of the upper active chip and the lower active chip facing toward outside; adding at least one layer of prepreg dielectric sheet between the upper supporting board and the lower supporting board, the total thickness of the at least one layer of prepreg dielectric sheet being greater than the thickness of the upper active chip or the thickness of the lower active chip or the sum of the thickness of the upper active chip and the thickness of the lower active chip;
   bonding the upper supporting board, the at least one layer of prepreg dielectric sheet, and the lower supporting board by vacuum thermal-compression such that the at least one upper active chip and the at least one lower active chip are embedded into the at least one layer of prepreg dielectric, and the at least one layer of prepreg dielectric sheet forms a core board after cured; and removing the temporary bonding film on both sides of the core board by de-bonding accompanied by removing the upper supporting board and the lower supporting board, such that the at least one upper active chip and the at least lower active chip are packaged into the core board to form the active chip package substrate.

8. The method for preparing the active chip package substrate according to claim 7, wherein:
the temporary bonding films are films for achieving bonding of the active chips and the supporting boards and the bonding thereof can be de-bonded by ultraviolet light, thermal decomposition, or solvent; and
the prepreg dielectric sheet is selected from any material of: epoxy resin, polyimide, bismaleimide-triazine resin, liquid crystal polymer, ABF film, polyphenylene ether, Teflon, parylene, or benzocyclobutene.

9. The method for preparing the active chip package substrate according to claim 7, wherein the material of the first passivation layers is silicon nitride, and the material of the second passivation layers is polyimide.

10. The method for preparing the active chip package substrate according to claim 7, wherein, prior to the step of cutting the wafer, the method further comprises a step of:
thinning and planarizing the back of the wafer.

11. The method for preparing the active chip package substrate according to claim 7, wherein, subsequent to the step of packaging the at least one upper active chip and the at least lower active chip into the core board, the method further comprises steps of:
making wiring dielectric layers and outer wiring layers on both sides of the core board;
forming blind holes on both sides of the core board, respectively, these blind holes passing through the wiring dielectric layers and the second passivation layers of the active chips, the active chips being the upper active chip and/or the lower active chip;
depositing metal in the blind holes to form conductive blind holes, the electrodes of the active chips being electrically connected to the outer wiring layers through the conductive blind holes; and
etching the outside wiring layers on both sides of the core board, respectively, to form outer circuit patterns.

12. The method for preparing the active chip package substrate according to claim 11, wherein prior to the step of etching the outside wiring layers on both sides of the core board, respectively, the method further comprises a step of:
forming conductive through holes on both sides of the core board, these conductive through holes electrically connecting the outer wiring layers on both sides of the core board.

13. The method for preparing the active chip package substrate according to claim 11, wherein, subsequent to the step of forming the outer circuit patterns, the method further comprises a step of:
forming one or more layers of the wiring dielectric layers and outer circuit patterns on at least one side of the core board.

14. The method for preparing the active chip package substrate according to claim 7, wherein
the step of bonding an active surface of at least one upper active chip to an upper supporting board by a temporary bonding film further comprises a step of: bonding an active surface of at least one passive element to the upper supporting board by the temporary bonding film; and/or the step of bonding an active surface of at least one lower active chip to an lower supporting board by a temporary bonding film further comprises a step of: bonding an active surface of at least one passive element to the lower supporting board by the temporary bonding film; and
the step of embedding the at least one upper active chip and the at least one lower active chip into the prepreg dielectric further comprises a step of: embedding the at least one passive element into the prepreg dielectric.

\* \* \* \* \*